(12) United States Patent
Glenn et al.

(10) Patent No.: US 8,081,837 B2
(45) Date of Patent: Dec. 20, 2011

(54) IMAGE SENSOR ARRAY LEAKAGE AND DARK CURRENT COMPENSATION

(75) Inventors: Robert C. Glenn, Bend, OR (US); Edward S. Milligan, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 1178 days.

(21) Appl. No.: 11/349,840

(22) Filed: Feb. 7, 2006

(65) Prior Publication Data

US 2007/0195179 A1 Aug. 23, 2007

(51) Int. Cl.
*G06K 9/40* (2006.01)
(52) U.S. Cl. ........... 382/267; 382/312; 382/100; 349/33
(58) Field of Classification Search ........ 382/267, 382/312, 100; 349/33
See application file for complete search history.

(56) References Cited

U.S. PATENT DOCUMENTS

| | | | | |
|---|---|---|---|---|
| 5,159,186 A * | 10/1992 | Ohzu | | 250/208.1 |
| 5,648,794 A * | 7/1997 | Jelsma et al. | | 345/98 |
| 5,654,755 A * | 8/1997 | Hosier | | 348/245 |
| 6,101,287 A * | 8/2000 | Corum et al. | | 382/274 |
| 6,175,383 B1 | 1/2001 | Yadid-Pecht et al. | | 348/302 |
| 6,351,519 B1 * | 2/2002 | Bonk et al. | | 378/98.8 |
| 6,388,245 B1 * | 5/2002 | Lee | | 250/208.1 |
| 6,522,355 B1 * | 2/2003 | Hynecek et al. | | 348/245 |
| 6,607,301 B1 * | 8/2003 | Glukhovsky et al. | | 374/175 |
| 6,614,562 B1 * | 9/2003 | Minemier | | 358/483 |
| 6,744,463 B2 * | 6/2004 | Rye et al. | | 348/159 |
| 6,747,695 B1 * | 6/2004 | Afghahi | | 348/241 |
| 6,882,064 B2 | 4/2005 | Glenn | | |
| 6,940,551 B2 * | 9/2005 | Merrill | | 348/301 |
| 7,280,141 B1 * | 10/2007 | Frank et al. | | 348/243 |
| 7,317,480 B1 * | 1/2008 | Cho et al. | | 348/243 |
| 7,362,365 B1 * | 4/2008 | Reyneri et al. | | 348/308 |
| 7,489,354 B2 * | 2/2009 | Lee et al. | | 348/308 |
| 7,787,032 B2 * | 8/2010 | Johnson | | 348/243 |
| 7,787,033 B2 * | 8/2010 | Rossi et al. | | 348/244 |
| 2001/0004269 A1 | 6/2001 | Shibata et al. | | |
| 2002/0030753 A1 * | 3/2002 | Kramer et al. | | 348/308 |
| 2002/0097446 A1 * | 7/2002 | Lee | | 358/406 |
| 2002/0101522 A1 * | 8/2002 | Hosier et al. | | 348/241 |
| 2002/0122126 A1 * | 9/2002 | Lenz | | 348/297 |
| 2003/0011831 A1 * | 1/2003 | Sakurai et al. | | 358/513 |
| 2003/0043263 A1 | 3/2003 | Glukhovsky et al. | | |
| 2003/0081132 A1 | 5/2003 | Kuno et al. | | |

(Continued)

FOREIGN PATENT DOCUMENTS

EP 0 479 534 4/1992

(Continued)

OTHER PUBLICATIONS

A CMOS—Operations, Cheng et al., 0018-9383, IEEE, 2003, pp. 91-95.*

(Continued)

*Primary Examiner* — Jayesh A Patel

(74) *Attorney, Agent, or Firm* — Trop, Pruner & Hu, P.C.

(57) ABSTRACT

Apparatus, systems and methods for image sensor leakage and dark current compensation are disclosed. In one implementation, a system comprises an imaging device including imaging pixels and two or more dark pixels, processing logic coupled to the imaging device, and an antenna coupled to the processing logic through an input/output (I/O) interface.

7 Claims, 5 Drawing Sheets

U.S. PATENT DOCUMENTS

| | | |
|---|---|---|
| 2003/0146987 A1 * | 8/2003 | Prentice et al. ............... 348/243 |
| 2004/0099920 A1 * | 5/2004 | Rossi et al. .................. 257/448 |
| 2004/0165101 A1 * | 8/2004 | Miyanari et al. ............. 348/363 |
| 2005/0195296 A1 | 9/2005 | Compton et al. |
| 2006/0095093 A1 * | 5/2006 | Bettesh et al. ................. 607/60 |
| 2006/0131484 A1 * | 6/2006 | Peting ....................... 250/214 R |

FOREIGN PATENT DOCUMENTS

| | | | |
|---|---|---|---|
| EP | 479534 A1 * | 4/1992 | |
| EP | 1 067 775 | 1/2001 | |
| EP | 1067775 A2 * | 1/2001 | |
| EP | 1117250 A2 * | 7/2001 | |
| WO | WO 97/39487 | 10/1997 | |

OTHER PUBLICATIONS

Fujifilm I & I Imaging and Information, 4th Generation Super CCD; 2003, 3 pages.

Chinese Patent Office, Office Action issued in corresponding Chinese Application No. 200710087966.3, 8 pages, Oct. 22, 2008.

* cited by examiner

IMAGE SENSOR ARRAY LEAKAGE AND DARK CURRENT COMPENSATION

BACKGROUND

Complementary metal oxide semiconductor (CMOS) image sensor arrays often have pixel well capacities as small as 10,000 (or less) electrons for full exposure and, when incorporated into a still image camera employing a global shutter, are required to retain charge on their hold capacitors during exposure and/or the readout time of the entire array. Resulting pixel well leakage currents on the order of one fA can unacceptably reduce the signal-to-noise ratio in such sensor arrays. Pixel leakage currents can be attributed to a variety of sources including gate current, diffusion current, device non-zero off-current and diode dark current. Moreover, pixel leakage current includes both static and dynamic components.

Conventional arrays have compensated for static leakage currents by adding a single, unexposed, extra pixel (often called a "dark pixel") in each row of the array. To compensate for static leakage current, the integrated current due to light-generated electron-hole pairs can be normalized against the integrated static charge developed on that row's dark pixel. Dynamic leakage currents, on the other hand, are highly dependent upon the signal amplitude at a given pixel's sample/hold node. These dynamic leakage currents often cause read-out error terms in excess of the static leakage induced error and may not be adequately compensated for using conventional dark pixel techniques.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description specific details may be set forth such as particular structures, architectures, interfaces, techniques, etc. in order to provide a thorough understanding of the various aspects of the claimed invention. However, such details are provided for purposes of explanation and should not be viewed as limiting with respect to the claimed invention. With benefit of the present disclosure it will be apparent to those skilled in the art that the various aspects of the invention claimed may be practiced in other examples that depart from these specific details. Moreover, in certain instances, descriptions of well known devices, circuits, and methods are omitted so as not to obscure the description of the present invention with unnecessary detail.

Figure 1:
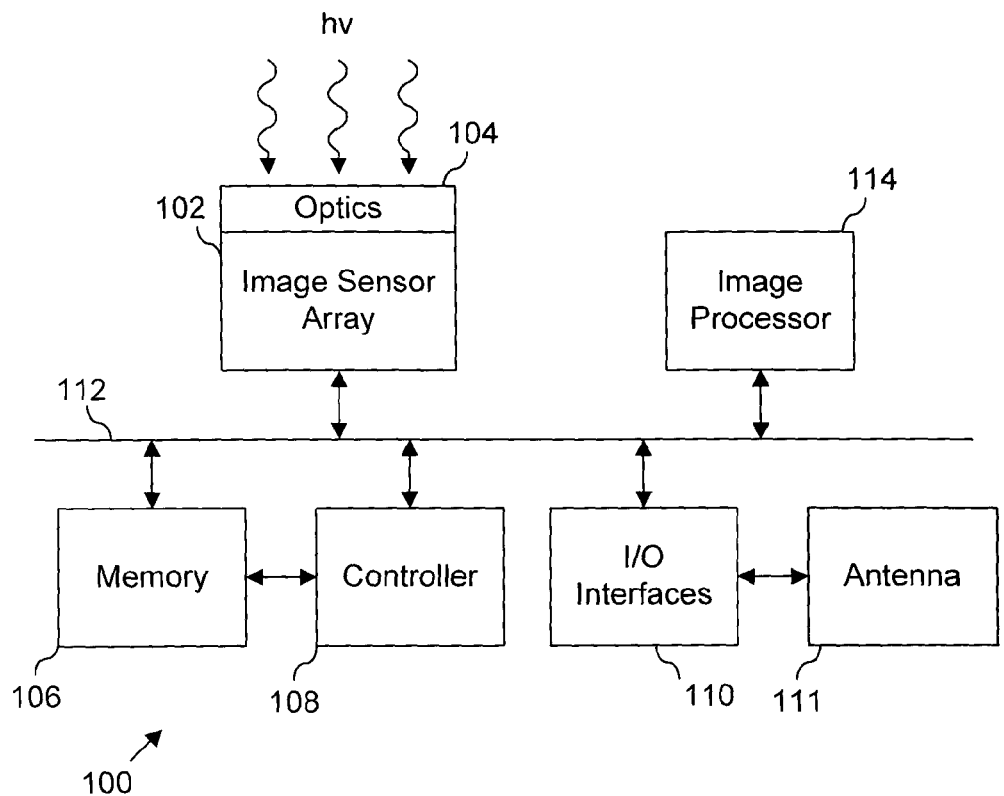
FIG. 1 illustrates an example imaging system.

FIG. 1 illustrates an example system 100 in accordance with an implementation of the invention. System 100 includes an image sensor 102, light gathering optics 104, memory 106, a controller 108, one or more input/output (I/O) interfaces 110 (e.g., universal synchronous bus (USB) interfaces, parallel ports, serial ports, wireless communications ports, and/or other I/O interfaces), an image processor 114, and a shared bus or other communications pathway 112 coupling devices 102 and 106-110 together for the exchange of image data and/or control data. System 100 may also include an antenna 111 (e.g., dipole antenna, narrowband Meander Line Antenna (MLA), wideband MLA, inverted "F" antenna, planar inverted "F" antenna, Goubau antenna, Patch antenna, etc.) coupled to I/O interfaces 110.

System 100 may assume a variety of physical manifestations suitable for implementation of image sensor leakage and dark current compensation in accordance with the invention. For example, system 100 may be implemented within a digital imaging device (e.g., digital camera, cellular telephone handset, personal digital assistant (PDA) etc.). Moreover, various components of system 100 may be implemented in an integrated configuration rather than as discrete components. For example, memory 106, controller 108 and interfaces 110 may be implemented within one or more semiconductor device(s) and/or integrated circuit (IC) chip(s) (e.g., within a chipset, system-on-a-chip (SOC), etc.). Where system 100 is implemented in a mobile computing device (e.g., PDA) and/or mobile communications device (e.g., cellular telephone handset) antenna 111 may enable wireless communication between system 100 and external devices and/or communications networks. In addition, various components that might be associated with system 100 but that are not particularly relevant to the claimed invention (e.g., audio components, display-related logic, etc.) have been excluded from FIG. 1 so as to not obscure the invention.

Image sensor array 102 may include an array of complementary metal oxide semiconductor (CMOS) diode elements or pixels although the invention is not limited in this regard and array 102 may include other types of semiconductor imaging elements, such as charge-coupled device (CCD) pixel elements. The invention is not, however, limited to a particular type of imaging pixel. In accordance with the invention one implementation of a sensor array, such as array 102, will be described in more detail below with respect to FIG. 2.

Light gathering optics 104 may be any collection of light gathering optical elements capable and/or suitable for collecting light and providing that light to array 102. Although those skilled in the art will recognize that optics 104 may comprise various optical components and/or arrangement of optical components, the specific nature of optics 104 is not limiting with respect to the invention and hence will not be described in further detail.

Memory 106 may be any device and/or mechanism capable of storing and/or holding imaging data including color pixel data and/or component values, to name a few examples. For example, although the invention is not limited in this regard, memory 106 may be either volatile memory such as static random access memory (SRAM), dynamic random access memory (DRAM), or non-volatile memory such as flash memory. Memory 106 may store and/or hold image frames including compensated output data derived from array 102 as explained in greater detail below.

Controller 108 may be, in various implementations, any logic and/or collection of logic devices capable of manipulating imaging data in order to implement image sensor leakage and dark current compensation processes in accordance with the invention. However, the invention is not limited in this regard and controller 108 may be implemented in a general purpose processor, microprocessor, and/or microcontroller to name a few other examples. Further, controller 108 may comprise a single device (e.g., a microprocessor, application specific IC (ASIC), etc.) or may comprise multiple devices. In one implementation, controller 108 may be capable of performing any of a number of tasks that support processes for sensor leakage and dark current compensation. These tasks may include, for example, although the invention is not limited in this regard, downloading microcode, initializing and/or configuring registers, and/or interrupt servicing.

In one implementation, controller 108 may include both control logic and processing logic. As will be explained in further detail below the control logic may be capable of applying different calibration potentials to the dark pixels, while the processing logic may be capable of using output data of the dark pixels to compensate output data of the imaging pixels. In another implementation, controller 108 may include processing logic while array 102 may include control logic. In a further implementation, array 102 may incorporate both such processing logic and/or control logic in whole or in part. Clearly the invention is not limited by which device incorporates the control and/or processing logic that may be associated with system 100.

Image processor 114 may be any collection of control and/or processing logic suitable for processing images provided by array 102 and/or controller 108 such that those images are in a suitable format for use by other devices that may be coupled to system 100 but are not shown in FIG. 1 (such as a display or a printer). In one implementation, processor 114 may comprise a display processor and/or controller at least capable of processing the output of array 102 to place it in a form suitable for displaying on a monitor or other type of display (not shown). For example, processor 114 may be capable of manipulating the resolution of the array's image data.

In another implementation, processor 114 may comprise a printer processor and/or controller at least capable of processing the output of array 102 to place it in a form suitable for printing on a printer or similar device (not shown). For example, processor 114 may be capable of color converting array's image data. In a further implementation, processor 114 may comprise a multimedia processor or controller at least capable of multimedia processing the output of array 102. For example, processor 114 may be capable of blending array's image data with other image data.

Figure 2A:
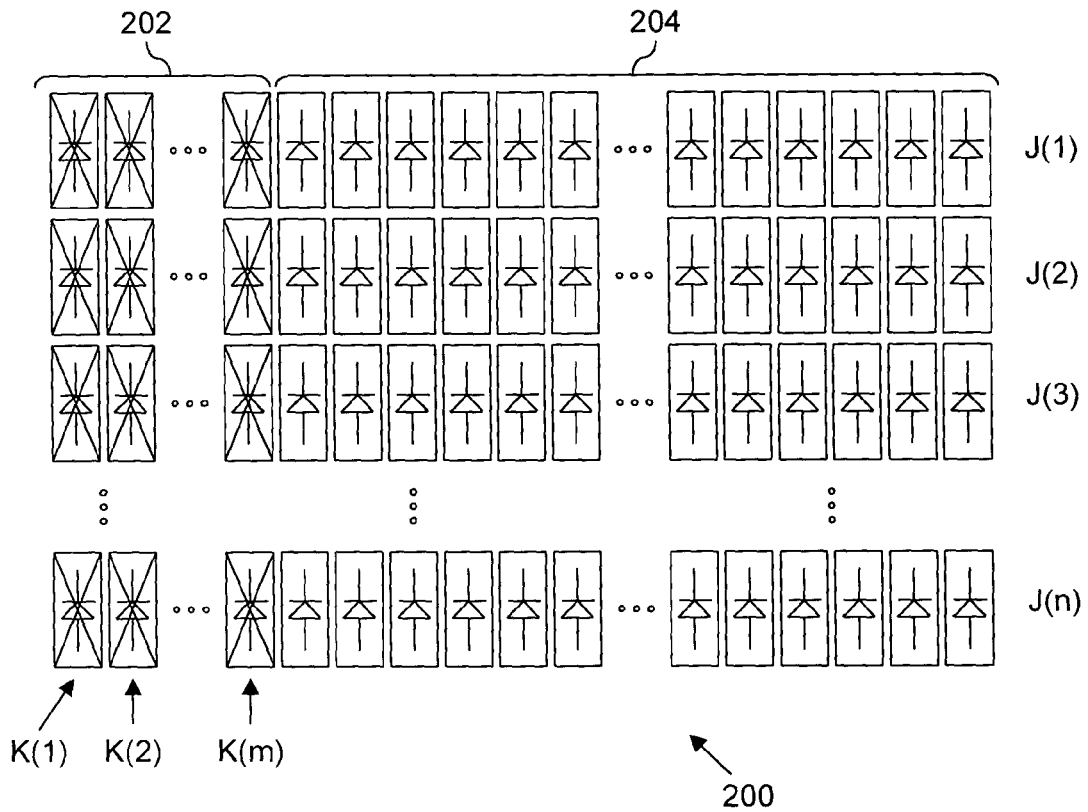
FIGS. 2A and 2B illustrate example implementations of imaging devices suitable for image sensor leakage and dark current compensation.

FIG. 2A illustrates portions of an imaging device including a sensor array 200, such as array 102 of FIG. 1, in accordance with an implementation of the invention. Array 200 includes (n) rows of CMOS imaging pixel elements 204 J(1)-J(n). In accordance with the invention, each row J of array 200 includes a plurality (m≧1) of dark pixels 202. Across array 200, pixels 202 may function as a plurality of calibration columns K(1)-K(m). In accordance with an implementation of the invention, array 200 may be physically arranged within system 100 such that pixels 202 of calibration columns K(1)-K(m) remain substantially un-exposed to light gathered by optics 104. Also in accordance with the invention, and as will be described in further detail below, each of the m dark pixels 202 in any particular row J may be biased to a different starting reset potential within the dynamic range of pixels 204.

Those of ordinary skill in the art will recognize that FIG. 2 illustrates an idealized representation of an image sensor array wherein many conventional components of an imaging sensor array (e.g., shutter mechanism, color filters, pixel row select addressing lines, column analog-to-digital converters, etc.) that are not particularly germane to the invention have been excluded from FIG. 2 in the interests of clarity.

Figure 2B:
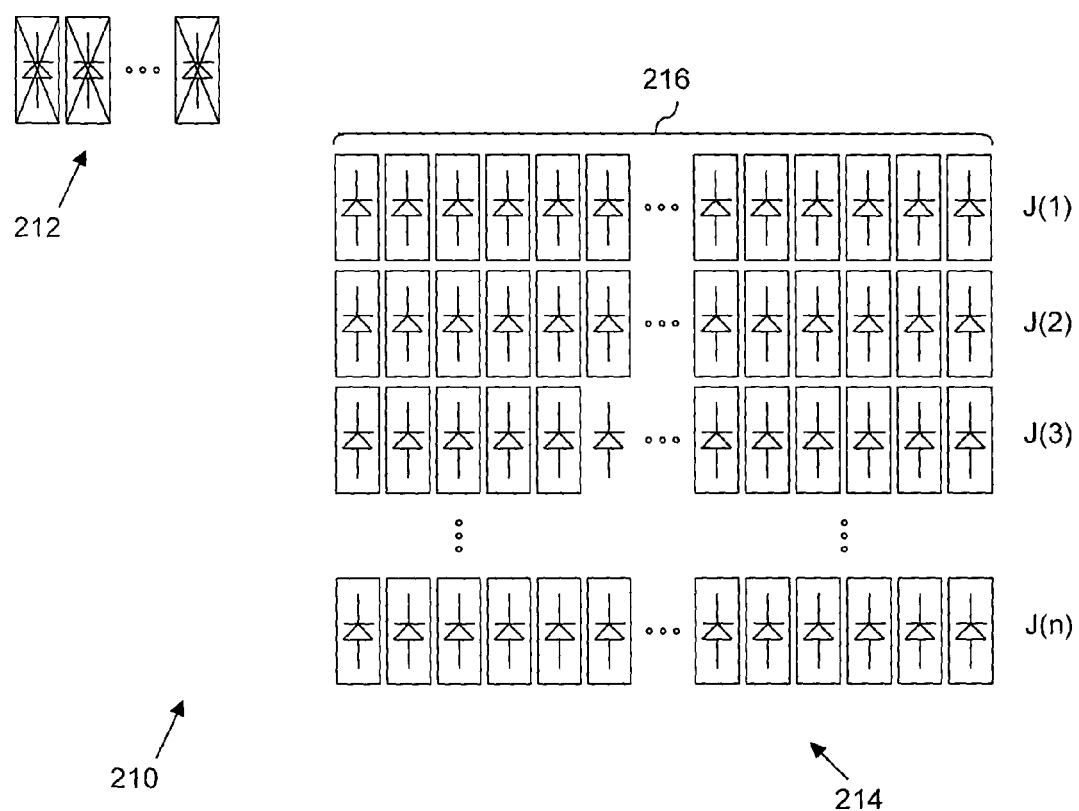

While FIG. 2A shows dark pixels 202 forming portions of rows J(1)-J(n), the invention is not limited to a placing dark pixels in a particular location with respect to the imaging array. In accordance with the invention, the one or more dark pixels are not required to be a physical part of the imaging pixel array, but, rather, may be located elsewhere on the IC die containing the imaging array. FIG. 2B illustrates an implementation 210 wherein one or more dark pixels 212 are placed away from an array 214 of imaging pixels 216. In accordance with the invention, dark pixels 212 may be located anywhere on the IC die containing array 214.

Figure 3:
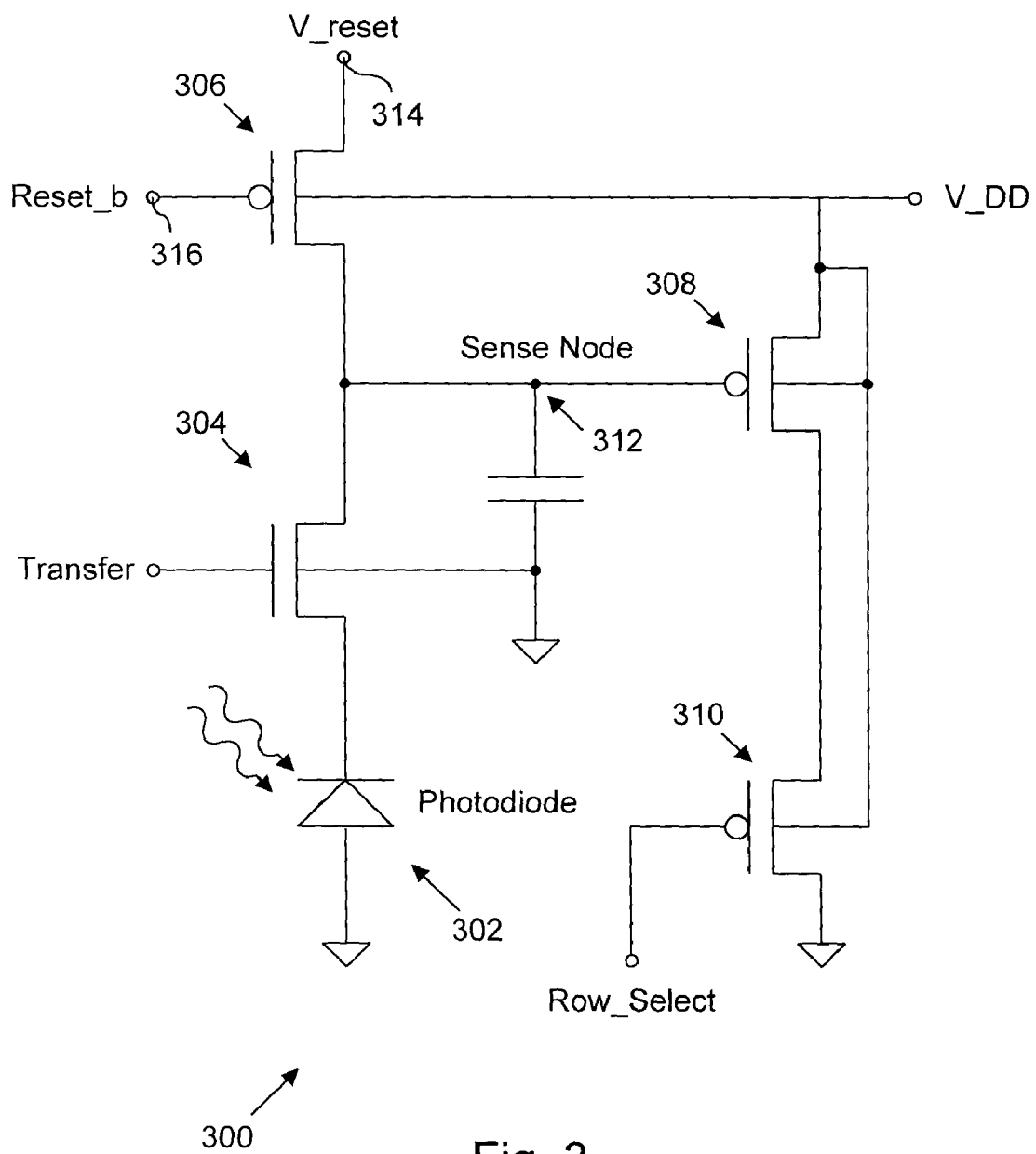
FIG. 3 is a schematic diagram of an imaging pixel of the sensor of FIG. 2A.

FIG. 3 is a schematic diagram of an imaging pixel 300 of array 200. Pixel 300 may represent an example pixel scheme for either pixels 202 or 204 of FIG. 2A. FIG. 3 is provided herein merely as a reference to aid discussion, below, of processes in accordance to the invention. Those of ordinary skill in the art will recognize that pixel 300 includes circuit elements of a conventional four-transistor or "pinned photodiode" CMOS imaging pixel. Pixel 300 includes, among other elements, a photodiode 302, transistors 304-310, a sense node 312, a reset voltage terminal 314, and a reset switch terminal 316. However, as stated above, the invention is not limited to a particular type of imaging pixel and pixel 300 is merely provided as an example of one implementation of a pixel. For example, a three-transistor or "non-pinned photodiode" imaging pixel would suffice equally well.

Figure 4:
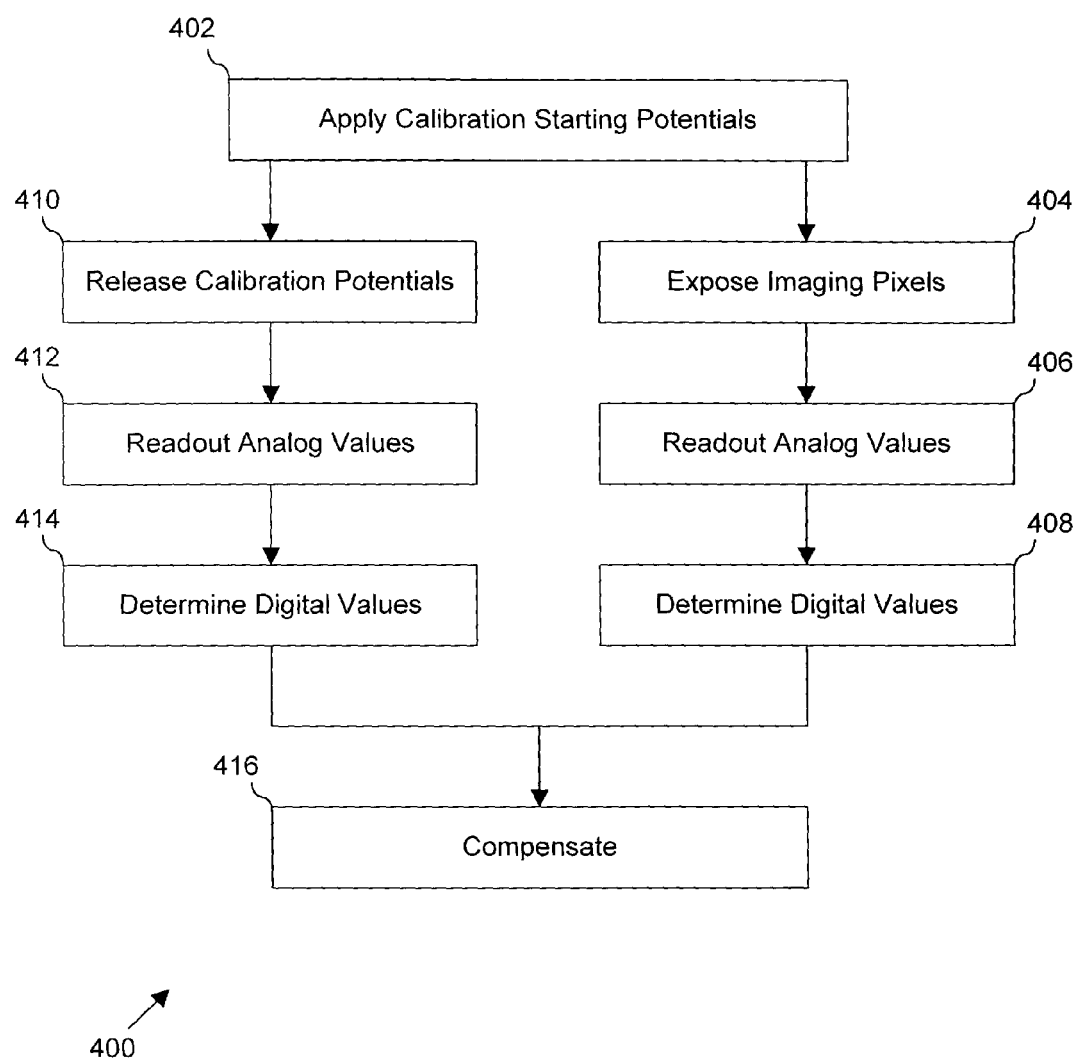
FIG. 4 is a flow chart illustrating an example process for image sensor leakage and dark current compensation.

FIG. 4 is a flow diagram illustrating a process 400 for image sensor leakage and dark current compensation in accordance with an implementation of the claimed invention. While, for ease of explanation, process 400, and associated processes, may be described with regard to system 100 of FIG. 1, array 200 of FIG. 2A, and/or pixel 300 of FIG. 3, the claimed invention is not limited in this regard and other processes or schemes supported and/or performed by appropriate devices and/or combinations of devices in accordance with the claimed invention are possible. Thus, while process 400 will be described in the context of an array, such as array 200 of FIG. 2A incorporating dark pixels into rows of the imaging array, the invention is not limited in this regard and process 400 may be implemented with an imaging device having dark pixels that are not incorporated directly into the imaging array but are located elsewhere on the imaging IC (e.g., as shown in FIG. 2B).

Process 400 may begin with the application of calibration potentials [act 402]. In one implementation, controller 108 may apply calibration potentials to one or more of pixels 202 in each row J of array 200 by setting and/or resetting terminal 314 of each of those pixels to a different predetermined reset potential. Hence, in accordance with one implementation of the invention, controller 108 may set and/or reset the calibration potentials of pixels 202 so that the pixels 202 in each calibration column K are set and/or reset to a different calibration potential from the pixels 202 in the other K-1 calibration columns as will be described in greater detail below with reference to FIG. 5.

Figure 5:
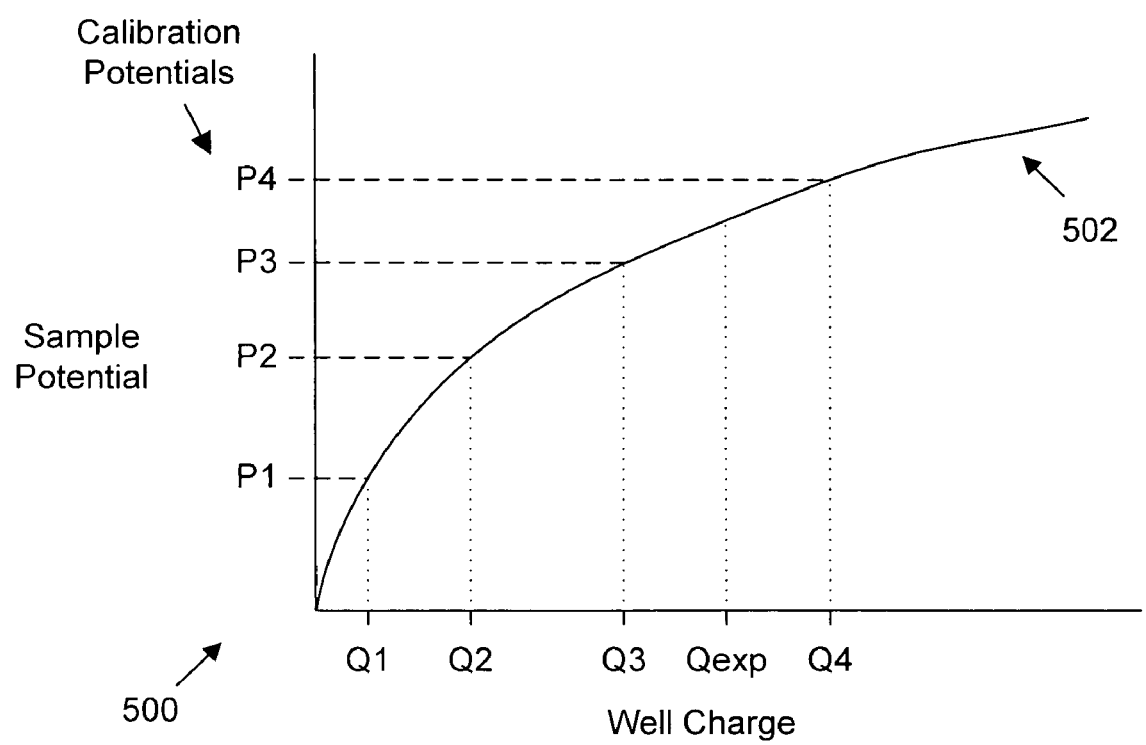
FIG. 5 illustrates a representative scheme for setting and/or resetting of calibration potentials consistent with the process of FIG. 4.

FIG. 5 illustrates an implementation of a representative calibration scheme 500 for setting and/or resetting calibration potentials consistent with act 402 of process 400. FIG. 5 illustrates a hypothetical dynamic range and/or response 502 for an imaging pixel such as pixel 300 upon exposure to varying amounts of light. In one implementation in accordance with the invention each one of pixels 202 occupying the separate calibrations columns K(1)... K(m) in each row J may be set and/or reset in act 402 to a different calibration potential. For example, as illustrated in representative scheme 500 implementing four calibration columns, the dark pixels 202 occupying calibration columns K(1), K(2), K(3) and K(4) in a particular row J may be set and/or reset to different respective calibration potentials P1, P2, P3, and P4 representative of a range of well charge values Q1, Q2, Q3, and Q4 in accordance with representative response curve 502. One way to carry out act 402 is for controller 108 to apply the different calibration potentials (i.e., P1, P2, P3, and P4 as predetermined under a calibration scheme such as scheme 500) by setting and/or resetting the appropriate voltage or calibration potential on the reset voltage terminal 314 of the respective calibration column pixels 202.

It should be noted, however, that the representative calibration potentials P1, P2, P3, and P4 shown in FIG. 5 are illustrative only and the invention is not limited to a particular number and/or value of calibration potentials set and/or reset in act 402. For example, when implemented in a sensor array bearing three calibration columns, three rather than four calibration potentials may be set and/or reset in act 402. Clearly, the choice of calibration potential values may depend upon the nature of the sensor array implemented and the resulting specific response function for that array's light-gathering pixels.

Referring again to FIG. 4, process 400 may continue with exposure of the imaging pixels to light [act 404]. In one implementation, all pixels 204 may be exposed simultaneously to light from optics 104 via a global shutter mechanism (not shown) initiated by controller 108 applying an appropriate shutter open control signal or potential to the shutter terminals of pixels 204. However, the invention is not limited in this regard and other exposure schemes, such as a rolling shutter, may also be implemented in act 404. In one implementation of the invention, while pixels 204 are exposed to light during act 404, controller 108 may inhibit exposure of dark pixels 202 by not applying a shutter open control signal to those pixel's shutter terminals.

Step 404 may be followed by a readout [act 406] of the analog potential value developed on those pixels illuminated in step 404. As those skilled in the art will recognize, the act of reading out the value of exposed pixels in a CMOS image array is well understood and will not be elaborated on further other than to state that one result of reading out an analog value of an exposed pixel in an imaging array (i.e., values for pixels 204 obtained in act 406) may be the determination of digital values corresponding to those analog values [act 408]. Those skilled in the art will recognize that acts 406 and/or 408 may be undertaken by controller 108 using well known techniques. Either the analog values readout in act 406 and/or the digital values determined in act 408 may be considered output data values of pixels 204.

Process 400 may include, in accordance with the invention, the release [act 410] of the calibration potentials set and/or reset in act 402. In one implementation act 410 may be accomplished by having controller 108 engage transistor 306 using the Reset_b terminal 316. In accordance with the invention, act 410 may take place at any time before, during or after the exposure of act 404. For example, in one implementation, act 410 may be undertaken at the beginning of act 404. Doing so may enable integration of dark current error on pixels 202.

Process 400 may continue with the readout of the analog value of dark pixels 202 [act 412] and the determination of digital values corresponding to those analog values [act 414].

The digital values determined in act 414 may be described as calibration values although the invention is in no way limited by the descriptive label applied to the digital values determined in act 414. Those skilled in the art will recognize that acts 412 and 414 may be undertaken by controller 108 using well known techniques.

Process 400 may continue with the compensation [act 416] of the digital values determined in act 408 using the digital values determined in act 414. One way to do this is to have controller 108 determine, for each pixel 204's output data value determined in act 408, a suitable calibration value from the digital calibration values determined in act 414. For example, referring to FIG. 5, if an exposed pixel 204 has an output data value corresponding to a well charge Qexp then controller 108 may compensate that value by determining a weighted average value of the digital calibration values derived from the calibration pixels 202 and then modifying the measured Qexp value by, for example, adding or substracting the weighted average value from the measured Qexp value. Thus, act 416 may be implemented by having controller 108 derive a compensation value from the dark pixels digital output data values (obtained in act 416) and then use that compensation value to determine compensated values for the imaging pixel's values (obtained in act 408). The resulting compensated value may thus incorporate a voltage dependent approximation of the integrated signal dependent leakage for exposed pixel 204 and may be considered to comprise compensated output data for that pixel.

While process 400 sets forth a specific implementation of the invention where the calibration values derived from dark pixels 202 are developed or integrated over the same time frame as the exposure values obtained from imaging pixels 204, the invention is not limited in this regard and other calibration schemes are possible consistent with the claimed invention. Thus, for example, in addition to using dark pixels to measure leakage values during an exposure period, such as in process 400, in other implementations of the invention, dark pixels could be used to measure leakage currents during a reset period spanning the time after reset and prior to exposure (i.e., using a mechanical shutter). Moreover, in accordance with the invention, other dark pixels could be used to measure leakage currents during other intervals such as during pixel hold periods, after exposure and prior to device readout, etc. All such implementations could be provided by one set of calibration pixels (such as dark pixels 212 of FIG. 2B) employing different integration time schemes where control logic, such as controller 108, keeps track of the temporally distinct calibration values that the different calibration pixels provide.

The acts shown in FIG. 4 need not be implemented in the order shown; nor do all of the acts necessarily need to be performed. For example, as discussed above, release of the calibration potentials in act 402 may be undertaken before, during and/or after exposure of the array in act 404. Also, those acts that are not dependent on other acts may be performed in parallel with the other acts. For example, acts 406 and 412 of process 400 may be undertaken in parallel. Moreover, some acts of processes 400 may be implemented in and/or undertaken using hardware and/or firmware and/or software. For example, the acts in process 400 of reading out analog values (acts 406 and 412) and/or determining digital values (acts 408 and 414) may be implemented using hardware, while other acts such as the compensation act (act 416) may be implemented in software and/or firmware. However, the invention is not limited in this regard and acts that may be implemented in hardware and/or firmware may, alternatively, be implemented in software. Clearly, many such combinations of software and/or hardware and/or firmware implementation of process 400 may be contemplated consistent with the scope and spirit of the invention. Further, at least some of the acts in process 400 may be implemented as instructions, or groups of instructions, implemented in a machine-readable medium.

The foregoing description of one or more implementations consistent with the principles of the invention provides illustration and description, but is not intended to be exhaustive or to limit the scope of the invention to the precise form disclosed. Modifications and variations are possible in light of the above teachings or may be acquired from practice of various implementations of the invention. Clearly, many implementations may be employed to provide a method, apparatus and/or system to implement image sensor leakage and dark current compensation consistent with the claimed invention.

No element, act, or instruction used in the description of the present application should be construed as critical or essential to the invention unless explicitly described as such. Also, as used herein, the article "a" is intended to include one or more items. In addition, some terms used to describe implementations of the invention, such as "data" and "value," may be used interchangeably in some circumstances. For example, those skilled in the art will recognize that the terms "pixel value" and "pixel data" may be used interchangeably without departing from the scope and spirit of the invention. Moreover, when terms such as "coupled" or "responsive" are used herein or in the claims that follow, these terms are meant to be interpreted broadly. For example, the phrase "coupled to" may refer to being communicatively, electrically and/or operatively coupled as appropriate for the context in which the phrase is used. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. A method comprising:
applying dynamic range calibrating potentials in accordance with a response curve to one dark pixel of an imaging device that are different from the dynamic range calibrating potentials applied to another dark pixel, said imaging device including an image array having imaging pixels, said dark pixels being unexposed pixels; and
using output data values of the one dark pixel and the another dark pixel to compensate a dynamic range of an output data value of the imaging pixels.

2. The method of claim 1, wherein using output data values of the one dark pixel and the another dark pixel to compensate an output data value of the imaging pixels comprising deriving a compensation value from the output data values of the one dark pixel and the another dark pixel, the compensation value comprising at least one of an average of the output data values of the one dark pixel and the another dark pixel or a weighted average of the output data values of the one dark pixel and the another dark pixel.

3. The method of claim 1, wherein the dynamic range calibration potentials comprise different starting reset potentials.

4. The method of claim 1, wherein applying dynamic range calibration potentials comprises applying different calibration potentials during at least one of an exposure period, a hold period, or a reset period of the image array.

5. An apparatus comprising:
two or more dark pixels, each having a terminal;
an array of imaging pixels in an imaging device; and
control logic coupled to the array, the control logic to apply dynamic range calibration potentials in accordance with a response curve to a first dark pixel that are different than dynamic range calibrating potentials applied to another dark pixel,
said dark pixels being unexposed pixels; and further comprising:
processing logic coupled to the imaging device, the processing logic at least capable of using output data value of the said first dark pixel and output data value of the said another dark pixel of the said two or more dark pixels to compensate a dynamic range of an output data value of the imaging pixels.

6. The apparatus of claim 5, wherein the dynamic range calibration potentials comprise different starting reset potentials.

7. The apparatus of claim 5, wherein the processing logic is at least capable of compensating the output data value of the imaging pixels by, at least in part, determining at least one of an average of the output data values of the first dark pixel and the another dark pixel of the said two or more dark pixels or a weighted average of the output data values of the first dark pixel and the another dark pixel of the said two or more dark pixels.

* * * * *